US012494348B2

(12) United States Patent
Ueda et al.

(10) Patent No.: US 12,494,348 B2
(45) Date of Patent: Dec. 9, 2025

(54) PLASMA PROCESSING APPARATUS AND MEMBER OF PLASMA PROCESSING CHAMBER

(71) Applicant: Hitachi High-Tech Corporation, Tokyo (JP)

(72) Inventors: Kazuhiro Ueda, Tokyo (JP); Kazuyuki Ikenaga, Tokyo (JP); Tomoyuki Tamura, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/115,124

(22) Filed: Feb. 28, 2023

(65) Prior Publication Data

US 2023/0207279 A1 Jun. 29, 2023

Related U.S. Application Data

(62) Division of application No. 16/357,971, filed on Mar. 19, 2019, now abandoned.

(30) Foreign Application Priority Data

Apr. 20, 2018 (JP) ................................ 2018-081089

(51) Int. Cl.
*H01J 37/32* (2006.01)
*C23C 4/134* (2016.01)
*C23C 14/06* (2006.01)

(52) U.S. Cl.
CPC ........ *H01J 37/32495* (2013.01); *C23C 4/134* (2016.01); *C23C 14/0694* (2013.01);
(Continued)

(58) Field of Classification Search
CPC ........... H01J 37/32495; H01J 37/32477; H01J 2237/332; H01J 2237/334;
(Continued)

(56) References Cited

U.S. PATENT DOCUMENTS

2004/0013911 A1 1/2004 Maeda
2004/0126614 A1 7/2004 Maeda et al.
(Continued)

FOREIGN PATENT DOCUMENTS

JP H08-020858 A 1/1996
JP H09-061318 A 3/1997
(Continued)

OTHER PUBLICATIONS

Office Action mailed Dec. 1, 2022 in U.S. Appl. No. 16/357,971.
(Continued)

*Primary Examiner* — Michael G Miller
(74) *Attorney, Agent, or Firm* — Miles & Stockbridge, P.C.

(57) ABSTRACT

A plasma processing apparatus includes: a processing chamber disposed inside a vacuum container and in which plasma is formed; and a member which is a member forming an inner wall surface of the processing chamber and is disposed on a surface to be exposed to the plasma and has a coating film formed by spraying of yttrium fluoride or a material containing the yttrium fluoride. A ratio of an orthorhombic crystal of the yttrium fluoride or the material containing the yttrium fluoride forming the coating film relative to the entirety is 60% or more.

2 Claims, 6 Drawing Sheets

(52) U.S. Cl.
CPC ... *H01J 37/32477* (2013.01); *H01J 2237/332* (2013.01); *H01J 2237/334* (2013.01)

(58) Field of Classification Search
CPC ............... H01J 37/32467; C23C 4/134; C23C 14/0694; C23C 4/00; C23C 4/02; C23C 4/10; C23C 4/11; C23C 4/18; C23C 16/4404; C23C 28/04; C23C 28/042; H01L 21/67069; H01L 21/02274; H01L 21/3065; H01L 21/31116; H01L 21/324; H01L 21/67103
See application file for complete search history.

(56) References Cited

U.S. PATENT DOCUMENTS

| | | | |
|---|---|---|---|
| 2009/0183835 A1 | 7/2009 | Furuse et al. | |
| 2009/0194233 A1 | 8/2009 | Tamura et al. | |
| 2013/0162142 A1 | 6/2013 | Nishino et al. | |
| 2015/0064406 A1 | 3/2015 | Harada et al. | |
| 2015/0075714 A1 | 3/2015 | Sun et al. | |
| 2015/0126036 A1 | 5/2015 | Zhao | |
| 2016/0332921 A1 | 11/2016 | Iwasawa et al. | |
| 2017/0140902 A1 | 5/2017 | Simpson et al. | |
| 2017/0152189 A1 | 6/2017 | Iwasawa | |
| 2017/0283313 A1 | 10/2017 | Lee et al. | |
| 2017/0292182 A1* | 10/2017 | Hamaya | C23C 28/04 |
| 2017/0323772 A1 | 11/2017 | Fenwick et al. | |
| 2017/0370007 A1 | 12/2017 | Iguchi et al. | |
| 2018/0127319 A1* | 5/2018 | Ashizawa | C04B 41/87 |
| 2018/0230022 A1 | 8/2018 | Seto et al. | |
| 2018/0251406 A1 | 9/2018 | Sun et al. | |
| 2018/0327892 A1 | 11/2018 | Wu et al. | |
| 2019/0169444 A1 | 6/2019 | Gangakhedkar | |
| 2019/0203330 A1 | 7/2019 | Ibe et al. | |
| 2019/0326101 A1 | 10/2019 | Ueda et al. | |

FOREIGN PATENT DOCUMENTS

| | | |
|---|---|---|
| JP | 2004-100039 A | 4/2004 |
| JP | 2004-197181 A | 7/2004 |
| JP | 2007-100124 A | 4/2007 |
| JP | 2007-224348 A | 9/2007 |
| JP | 4006596 B2 | 11/2007 |
| JP | 2009-176787 A | 8/2009 |
| JP | 2010-095780 A | 4/2010 |
| JP | 2013-140950 A | 7/2013 |
| JP | 2014-141390 A | 8/2014 |
| JP | 2016-027624 A | 2/2016 |
| JP | 2016-089241 A | 5/2016 |
| JP | 2016-539250 A | 12/2016 |
| JP | 2017-150085 A | 8/2017 |
| JP | 2017-190475 A | 10/2017 |
| JP | 2018-082154 A | 5/2018 |
| JP | 2018-190985 A | 11/2018 |
| JP | 2019-192701 A | 10/2019 |
| JP | 2020-511388 A | 4/2020 |
| TW | 201943870 A | 11/2019 |
| TW | I687508 B | 3/2020 |
| WO | 2017043117 A1 | 3/2017 |
| WO | 2019112962 A1 | 6/2019 |
| WO | 2021124996 A1 | 6/2021 |

OTHER PUBLICATIONS

Office Action mailed Feb. 17, 2022 in U.S. Appl. No. 16/357,971.
Office Action mailed Oct. 15, 2021 in U.S. Appl. No. 16/357,971.
Office Action mailed Mar. 18, 2021 in U.S. Appl. No. 16/357,971.
Search Report mailed Mar. 31, 2020 in International Application No. PCT/JP2019/050252.
Written Opinion mailed Mar. 31, 2020 in International Application No. PCT/JP2019/050252.
Search Report mailed Jul. 20, 2021 in International Application No. PCT/JP2021/024419.
Tadashi Morita, "Thermal Spraying and Regenerative Surface Treatment Technologies for Inner Part of Vacuum Equipment", Journal of the Vacuum Society of Japan, 2017, 60., No. 3, pp. 102-104.
Written Opinion mailed Jul. 20, 2021 in International Application No. PCT/JP2021/024419.
Office Action mailed Feb. 2, 2023 in Taiwanese Application No. 111123250.
Akihide Kuwabara et al., "Analysis of Phase Stability in Cubic Zirconia Solid Solutions by First Principle Molecular Orbital Method," Journal of the Society of Materials Science, Japan, vol. 50, No. 6, Jun. 2001, p. 619-624.
Kazuhiro Ueda et al., "Examination of Crystalline Structure of Yttrium-Based Material for Plasma Etching Apparatuses and Particles Generation Mechanism," The Discussion Group of X-Ray Analysis, The Japan Society for Analytical Chemistry, Advances in X-Ray Chemical Analysis 50, AGNE Gijutsu Center Inc., Apr. 2019, p. 197-205.
Masao Sato et al., "Manufacturing of Yttrium Iron Garnet Single Crystal by YF3—PbF2 Melted Salt Bath," Journal of the Ceramic Society, vol. 71, No. 805, 1963, p. 101-104.
Masayuki Takashima et al., "Formation and Electrical Conductivity of Yttrium Fluoride Stabilized Zirconia," Denki Kagaku oyobi Kogyo Butsuri Kagaku, vol. 53, No. 2, Feb. 1985, p. 119-124.
Search Report mailed Oct. 11, 2022 in International Application No. PCT/JP2022/032583.
Office Action mailed Oct. 4, 2024 in Taiwanese Application No. 112129759.

* cited by examiner

PLASMA PROCESSING APPARATUS AND MEMBER OF PLASMA PROCESSING CHAMBER

CROSS-REFERENCE TO RELATED APPLICATIONS

The present application claims priority to Japanese Patent Application No. 2018-081089, filed Apr. 20, 2018. The contents of this application are incorporated herein by reference in their entirety.

BACKGROUND OF THE INVENTION

1. Field of the Invention

The present invention relates to a plasma processing apparatus or a member of a plasma processing chamber, which forms plasma inside a processing chamber inside a vacuum container to process a sample to be processed, such as a semiconductor wafer to be processed, disposed inside the processing chamber, and particularly to the plasma processing apparatus or the member of the plasma processing chamber provided with a protective coating film on a surface facing the plasma inside the processing chamber.

2. Description of the Related Art

In a process of processing a semiconductor wafer to manufacture an electronic device or a magnetic memory, etching using plasma is applied for fine processing configured to form a circuit structure on the wafer surface. Such processing using the plasma etching is required to have higher precision and yield along with higher integration of devices.

In a plasma processing apparatus used for the plasma etching, a processing chamber is disposed inside a vacuum container, and an internal member of the processing chamber is typically made of metal such as aluminum, and stainless steel in terms of strength and cost. Further, a surface of the internal member of the processing chamber is exposed to plasma to be formed to be brought into contact with or face the plasma, and thus, it is general to dispose a coating film having a high plasma resistance on the surface of the member such that the surface of the member is not worn out by the plasma over a longer period of time or such that a change in quantity or property of mutual action between the plasma and the surface of the member is suppressed.

As an example of a technique of the processing chamber internal member using plasma with such a coating film having a plasma resistance, one disclosed in JP 4006596 B2 is conventionally known. In JP 4006596 B2, a coating film of yttrium oxide is illustrated as an example of the above coating film.

In general, it is known that a coating film using yttrium oxide can be formed in either vacuum or atmospheric atmosphere by a method such as plasma spraying, SPS spraying, explosion spraying, and reduced-pressure spraying. For example, an atmospheric plasma spraying method is a technique of introducing raw material powder having a predetermined particle diameter, for example, a diameter in the range of 10 to 60 μm, into a plasma flame together with a transport gas to form a molten or semi-molten state and spraying raw material particles in such a state onto a surface of a base member to be coated to form a film. Meanwhile, this spraying method has a problem of a height of a surface of the formed coating film, a problem that a variation of so-called unevenness is large, and a problem that pores are formed between grains of the coating film, which have been attached to each other in the molten or semi-molten state, cooled and solidified, and a gas in the plasma or product particles enter the pores to induce contamination and particles.

Conventionally, many solutions have been studied regarding such problems. For example, those disclosed in JP 2014-141390 A and JP 2016-27624 A are known. In these patent literatures, a so-called aerosol deposition method is disclosed. This technique forms a film by blowing raw material powder having a diameter of about several μm onto the surface of the substrate to be coated at speed close to the speed of sound to form a layered structure having microcrystals with a size of 8 to 50 nm as a coating film, and is known to have a feature that it is possible to reduce the unevenness of the surface more than the above atmospheric plasma spraying method.

When being exposed to plasma of a fluorine-based gas, the coating film made of yttrium oxide reacts with fluorine and the like in the plasma and the coating film is worn out. Therefore, a change of the coating film to yttrium fluoride has been studied. JP 2013-140950 A discloses a technique of forming a coating film made of yttrium fluoride by an atmospheric plasma spraying method.

Further, studies have proceeded regarding suppression of cracks, reduction of surface roughness, improvement of a breakdown voltage, and the like in film formation of an yttrium fluoride coating film. JP 2017-190475 A discloses a range of a value of a specific mixture ratio between yttrium fluoride granulated powder and yttrium oxide granulated powder which are sprayed materials capable of obtaining a sprayed coating film of an yttrium-based fluorinated compound that has a sufficient corrosion resistant performance against plasma and can effectively prevent damage to a substrate due to acid penetration during acid cleaning. Further, JP 2017-150085 A discloses a technique of supplying a slurry containing particles of yttrium fluoride having an average particle diameter in a specific range to a position separated downward from a nozzle of a spray gun in a direction along a central axis of the nozzle of the spray gun that releases a frame in a high-speed flame spraying method or the nozzle of the spray gun that releases a plasma jet in an atmospheric pressure plasma spraying method, or to a distal end position of the nozzle as a process of manufacturing a sprayed coating film made of yttrium fluoride which can suppress generation of particles.

SUMMARY OF THE INVENTION

However, there are problems in the above-described conventional techniques still due to insufficient consideration for the following points. That is, as the precision of processing required for the plasma processing apparatus used in the plasma etching increases, a size of a foreign matter generated during the processing inside the processing chamber disposed inside the vacuum container of the apparatus also decreases. In this manner, there is a demand for suppression of generation of fine particles having a smaller diameter as well.

In the above-described conventional techniques using the yttrium fluoride as the material, conditions for generation of a sprayed coating film capable of sufficiently suppressing the above-described corrosion and generation of fine particles are not sufficiently taken into consideration. Although JP 2014-141390 A and JP 2016-27624 A disclose conditions of the coating film disposed on a surface of a member forming an inner wall of the processing chamber to suppress the generation of fine particles, there is no consideration for conditions that need to be satisfied when the coating film is generated using the spraying method. Thus, in the conventional techniques, contamination of a sample to be processed occurs due to the generated particles so that a processing yield is impaired.

An object of the present invention is to provide a plasma processing apparatus, an internal member of the plasma processing apparatus, or a method of manufacturing the plasma processing apparatus and the internal member in which generation of particles is reduced to improve a processing yield. This object may be achieved by a plasma processing apparatus including: a processing chamber disposed inside a vacuum container and in which plasma is generated; and a member constituting an inner wall surface of the processing chamber and which is disposed to be exposed to the plasma.

Accordingly, embodiments can include a plasma processing manufacturing method including a step of: forming a coating film on a region of a surface by plasma spraying in atmosphere of yttrium fluoride or a material containing the yttrium fluoride, in which the surface constitutes an inner wall surface of a member disposed inside a vacuum container of a plasma processing apparatus, the inner wall surface is constructed to be exposed to plasma of a processing chamber disposed inside the vacuum container and in which plasma is generated, in which the ratio of an orthorhombic crystal of the yttrium fluoride or the material containing the yttrium fluoride forming the coating film relative to the entirety is 60, or more, or the member of the plasma processing chamber, and in which a size of the crystal of the yttrium fluoride or a material containing the yttrium fluoride in the coating film is 50 nm or smaller.

Further, embodiments can also include a method of manufacturing a member of a plasma processing chamber in which plasma generated, the method including forming a coating film by spraying particles of the yttrium fluoride or the material containing the yttrium fluoride using atmospheric plasma onto the member, in which the member comprises an inner wall surface of the plasma processing chamber and is disposed on a surface to be exposed to the plasma, a ratio of an orthorhombic crystal of the yttrium fluoride or the material containing the yttrium fluoride in the coating film relative to entirety is 60% or more, and a size of the crystal of the yttrium fluoride or a material containing the yttrium fluoride in the coating film is 50 nm or smaller.

Further, the embodiments can further include spraying the particles of the yttrium fluoride or the material containing the yttrium fluoride using atmospheric plasma to form the coating film, and then, performing a surface treatment for heating a surface of the coating film to 280° C. or higher and at 350° C. or lower.

In the plasma processing apparatus or the member therefor according to the present invention, it is possible to reduce generation of particles from the coating film on the surface of the member disposed inside the processing chamber.

DESCRIPTION OF THE PREFERRED EMBODIMENTS

Hereinafter, an embodiment of the present invention will be described with reference to the drawings.

Embodiment

Hereinafter, an embodiment of the present invention will be described with reference to FIGS. 1A to 6.

Figure 1A:
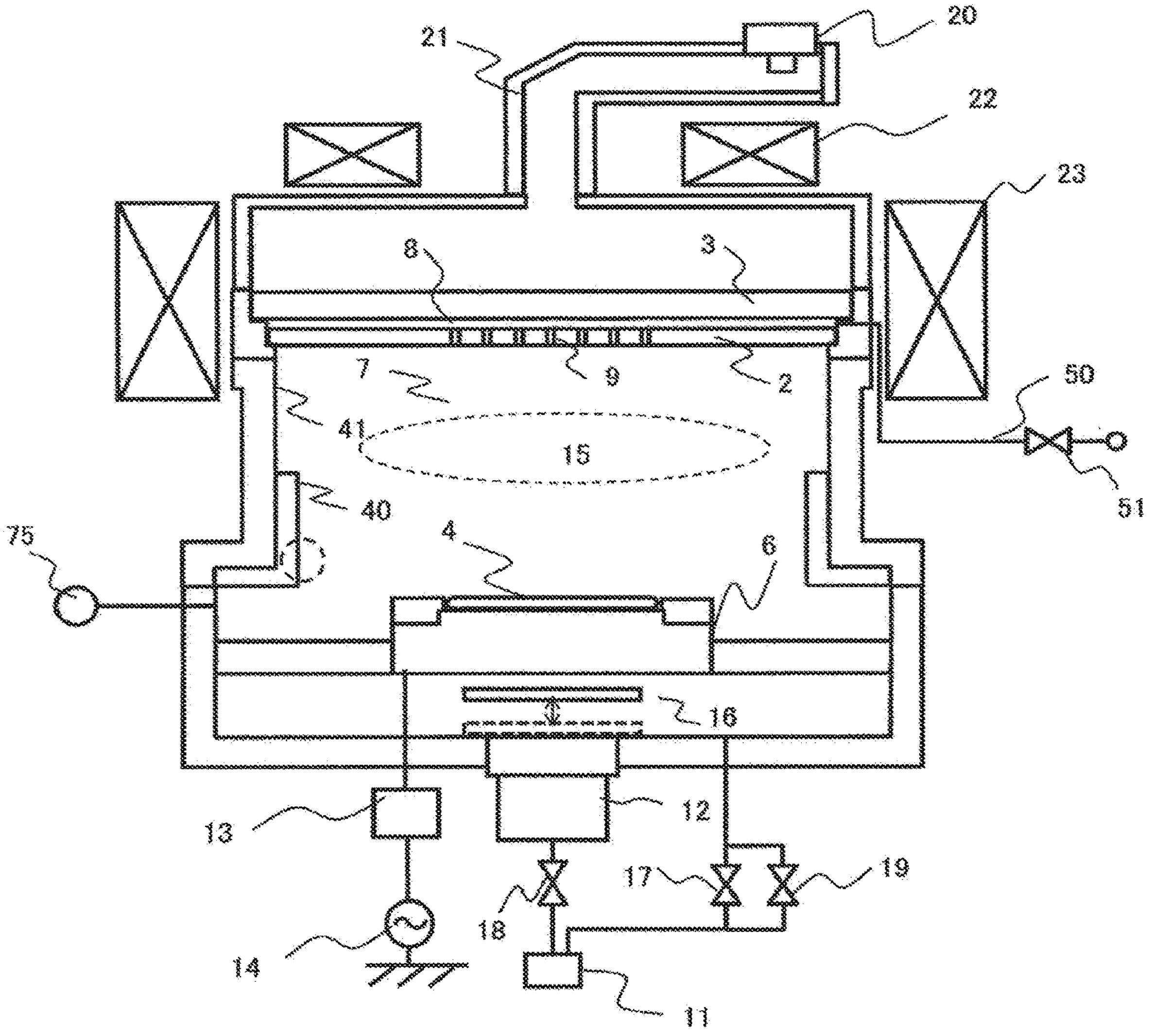
FIG. 1A is a schematic outline of a configuration of a plasma processing apparatus according to an embodiment.
Figure 1B:
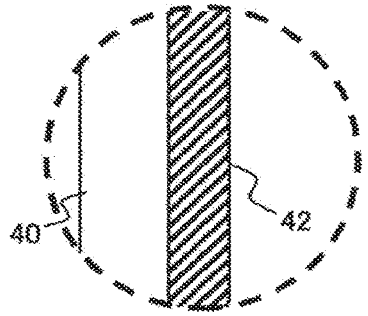
FIG. 1B is a vertical cross-sectional view schematically illustrating the outline of a configuration of a plasma processing apparatus according to an embodiment of the present invention.

FIG. 1A is a schematic cross-sectional view of a plasma processing apparatus. FIG. 1B is a vertical cross-sectional view schematically illustrating an outline of a configuration of the plasma processing apparatus according to the embodiment of the present invention.

The plasma processing apparatus of the present embodiment includes: a vacuum container having a cylindrical portion; a plasma formation unit disposed around the top or the periphery of the side of the cylindrical portion so as to surround the top or the periphery of the side of the cylindrical portion; and a vacuum exhaust unit including a vacuum pump disposed below the vacuum container and exhausting the interior of the vacuum container. A processing chamber 7, which is a space where plasma is formed, is disposed inside the vacuum container, and is configured to be capable of communicating with the vacuum exhaust unit.

An upper part of the processing chamber 7 forms a discharge chamber which is a space surrounded by an inner wall having a cylindrical shape and in which plasma 15 is formed.

Inside the processing chamber 7 below the discharge chamber where the plasma 15 is generated, a stage 6, which is a sample stage that allows a wafer 4 as a substrate to be processed to be placed on an upper surface thereof and held, is disposed.

The stage 6 of the present embodiment is a member having a cylindrical shape of which a center axis in the vertical direction is disposed to be concentric with the discharge chamber or at a position which is moderately approximate to such a concentric position to be regarded as the concentric position when seen from the above, a space is formed between a bottom surface of the processing chamber 7 in which an opening communicating with the vacuum exhaust unit is disposed and a bottom surface of the stage 6, and the stage 6 is held at an intermediate position between an upper end surface and a lower end surface in the vertical direction of the processing chamber 7. The space inside the processing chamber 7 below the stage 6 communicates with the discharge chamber through a gap between a side wall of the stage 6 and an inner wall surface of the processing chamber 7 surrounding the stage 6 to form an exhaust path through which a product generated on an upper surface of the wafer 4 and in the discharge chamber during the processing of the wafer 4 on the upper surface of the stage 6, the plasma inside the discharge chamber, and gas particles pass to be discharged to the outside of the processing chamber 7 by the vacuum exhaust unit.

On the stage 6 of the present embodiment, a heater (not illustrated) that has a base member, which is a metal member having a cylindrical shape, and a film made of a dielectric, disposed so as to cover an upper surface of the base member, disposed therein and a refrigerant flow path (not illustrated) disposed in multiple inside the base member concentrically or spirally around the central axis. Further, in a state where the wafer 4 is placed on the upper surface of the film made of the dielectric of the stage 6, a gas having heat conductivity such as He is supplied to the gap between a lower surface of the wafer 4 and an upper surface of the dielectric film. Therefore, a pipe through which a gas having heat conductivity flows is disposed inside the base member and the film made of the dielectric (not illustrated).

Further, the base member of the stage 6 is connected with a radio-frequency power supply 14, which supplies a radio-frequency power to form an electric field for attraction of charged particles in the plasma above the upper surface of the wafer 4 during the processing of the wafer 4 by the plasma, by a coaxial cable via an impedance matching unit 13. In addition, film-shaped electrodes to which DC power for generation of an electrostatic force to attract and hold the wafer 4 onto the upper surface of the dielectric film inside the dielectric film and the wafer 4 is supplied are disposed above the heater inside the dielectric film above the base member to be symmetric about the center axis at each of a plurality of regions in the radial direction from the center axis in the vertical direction of a substantially circular upper surface of the wafer 4 or the stage 6 such that different polarities can be imparted to the respective electrodes.

A window member 3, which is disposed to oppose the upper surface of the stage 6 and has a discoid shape made of a dielectric material such as quartz and ceramics that forms the upper part of the vacuum container to hermetically seal the inside and the outside of the processing chamber 7, is provided above the upper surface of the stage 6 of the processing chamber 7. Further, a shower plate 2, which is disposed with a gap 8 from a lower surface of the window member 3, includes a plurality of through-holes 9 at a central portion thereof, and has a discoid shape made of a dielectric material such as quartz, is provided at a position which locates below the window member 3 and forms a ceiling surface of the processing chamber 7.

The gap 8 is connected to the vacuum container so as to communicate with a processing gas supply pipe 50, and a valve 51 which opens or closes the inside is disposed at a predetermined location on the processing gas supply pipe 50.

A flow rate or speed of a gas for processing (processing gas) to be supplied to the inside of the processing chamber 7 is controlled by a gas flow rate control means (not illustrated) connected to one end side of the processing gas supply pipe 50. The processing gas flows into the gap 8 through the processing gas supply pipe 50 with the valve 51 opened, and then, diffuses inside the gap 8 and is supplied into the processing chamber 7 from above through the through-hole 9.

The vacuum exhaust unit, which discharges the gas and particles inside the processing chamber 7 via an exhaust port that is an opening for exhaust disposed immediately below the stage 6 on a bottom surface of the processing chamber 7 with substantially the same central axis in the vertical direction, is disposed below the vacuum container. The vacuum exhaust unit includes a pressure adjustment plate 16 which is a discoid valve which moves up and down above the exhaust port to increase or decreases the area of a flow path through which the gas flows into the exhaust port, and a turbo molecular pump 12 which is the vacuum pump. Further, in the vacuum exhaust unit, an outlet of the turbo molecular pump 12 is connected to a dry pump 11, which is a rough vacuum pump, via an exhaust pipe and communicates therewith, and a valve 18 is disposed on the exhaust pipe.

The pressure adjustment plate 16 of the present embodiment also serves as a valve for opening and closing the exhaust port. The vacuum container is provided with a pressure detector 75 which is a sensor configured to detect the pressure inside the processing chamber 7. A signal output from the pressure detector 75 is transmitted to a controller (not illustrated) to detect a value of the pressure, and the pressure adjustment plate 16 is driven to change a position in the vertical direction based on a command signal output from the control unit in accordance with the value so that the area of the flow path of the exhaust gas is increased or decreased. Between a valve 17 and a valve 19 connected to the exhaust pipe 10, the valve 17 is a slow-exhaust valve configured to slowly exhaust the processing chamber 7 from the atmospheric pressure to a vacuum using the dry pump 11, and the valve 19 is a main exhaust valve configured for high-speed exhaust using the dry pump 11.

A configuration for formation of an electric field or a magnetic field to be supplied to the processing chamber 7 in order to form plasma is disposed in the periphery surrounding the top and a side wall of the cylindrical portion of the upper part of the vacuum container forming the processing chamber 7. That is, a waveguide 21 which is a conduit through which an electric field of microwaves supplied into the processing chamber 7 propagates the inside is disposed above the window member 3, and a magnetron oscillator 20 that outputs the microwave electric field in an oscillating manner is disposed at one end portion of the waveguide 21. The waveguide 21 has a rectangular waveguide portion which has a rectangular vertical section and an axis extending in the horizontal direction, and has the magnetron oscillator 20 disposed at the one end portion, and a circular waveguide portion which is connected to the other end portion of the rectangular waveguide portion and has a central axis extending in the vertical direction and has a circular cross section. A lower end portion of the circular waveguide portion has a cylindrical shape whose diameter is enlarged and a cavity in which an electric field of a specific mode is intensified disposed therein. A plurality of stages of a solenoid coil 22 and a solenoid coil 23 each serving as a magnetic field generating means are provided so as to surround the top and the periphery of the cavity, and further, the periphery of the side of the processing chamber 7.

In such a plasma processing apparatus, the unprocessed wafer 4 is placed at a distal end portion of an arm of a vacuum transport device (not illustrated) such as a robot arm, disposed inside a transport chamber, is transported inside the transport chamber inside a vacuum transport container, which is another vacuum container (not illustrated) connected to the side wall of the vacuum container, into the processing chamber 7 and is delivered to the stage 6 to be placed on the upper surface of the stage 6. When the arm of the vacuum transport device exits the processing chamber 7, the inside of the processing chamber 7 is sealed, and the wafer 4 is held on the dielectric film by an electrostatic force generated as a voltage of a DC current is applied to the electrode for electrostatic suction inside the dielectric film. In this state, the gas having a heat transfer property such as He is supplied through the pipe disposed inside the stage 6 into the gap between the wafer 4 and the upper surface of the dielectric film forming the upper surface of the stage 6. As a refrigerant whose temperature is controlled within a predetermined range by a refrigerant temperature controller (not illustrated) is supplied to the internal refrigerant flow path, the transfer of heat between the temperature-controlled base material and the wafer 4 is promoted, and the temperature of the wafer 4 is adjusted to a value within a range appropriate for the start of processing.

The processing gas whose flow rate or speed has been controlled by the gas flow rate control means passes through the processing gas supply pipe 50 and is supplied from the gap 8 into the processing chamber 7 through the through-hole 9, the inside of the processing chamber 7 is exhausted through the exhaust port by the operation of the turbo molecular pump 12, and the pressure inside the processing chamber 7 is controlled to a value within a range appropriate for processing due to a balance therebetween. In this state, the microwave electric field oscillating from the magnetron oscillator 20 propagates inside the waveguide 21, passes through the window member 3 and the shower plate 2, and is radiated into the processing chamber 7. Further, the magnetic field generated by the solenoid coils 22 and 23 is supplied to the processing chamber 7, electron cyclotron resonance (ECR) is generated by the interaction between the magnetic field and the microwave electric field, atoms or molecules of the processing gas are excited, ionized, and dissociated to generate the plasma 15 inside the processing chamber 7.

When the plasma 15 is formed, radio-frequency power from the radio-frequency power supply 14 is supplied to the base material, a bias potential is formed above the upper surface of the wafer 4, charged particles such as ions in the plasma 15 are attracted to the upper surface of the wafer 4, and an etching process of a film layer to be processed having a film structure including a plurality of film layers including a film layer to be processed and a mask layer, formed in advance on the upper surface of the wafer 4, proceeds along a pattern shape of the mask layer. When a detector (not illustrated) detects that the processing of the film layer to be processed has reached its end point, the supply of the radio-frequency power from the radio-frequency power supply 14 is stopped, and the plasma 15 is extinguished to stop the processing.

When the control unit determines that it is not necessary to proceed the etching process of the wafer 4 further, high-vacuum exhaust is performed. Further, the arm of the vacuum transport device enters the processing chamber 7 to deliver the processed wafer 4 after the static electricity is removed and the suction of the wafer 4 is released, and then, the wafer 4 is carried out of the vacuum transport chamber outside the processing chamber 7 along with a contraction of the arm.

The inner wall surface of the processing chamber 7 is a surface that faces the plasma 15 and is exposed to particles of the plasma 15.

Meanwhile, it is necessary to dispose a member, which faces the plasma and functions as a ground electrode in contact with the plasma, inside the processing chamber 7 in order to stabilize a potential of the plasma 15 which is a dielectric.

In the plasma processing apparatus of the present embodiment, a ground electrode 40, which is a ring-shaped member that covers a surface of a lower part of the inner wall of the processing chamber 7 surrounding the discharge chamber and is disposed above and the upper surface of the stage 6 to surround the periphery thereof, is disposed for the purpose of providing a function as the ground electrode. The ground electrode 40 includes a base made of a material having a conductivity and a coating film covering a surface of the base. In the present embodiment, the base of the ground electrode is made of metal such as a stainless steel alloy and an aluminum alloy.

When there is no coating film on a surface of the base, the ground electrode 40 serves as a source of generating corrosion and particles which cause contamination of the wafer 4 by being exposed to the plasma 15 at the place. Thus, a coating film 42 made of a material having a high plasma resistance is disposed on the surface of the ground electrode 40 so as to cover the base in order to suppress the contamination. Due to the coating film 42 covering an inner wall material, it is possible to suppress damage by the plasma while maintaining the function as the electrode of the ground electrode 40 using the plasma.

Incidentally, the coating film 42 may be a laminated film. In the present embodiment, a film integrally formed by spraying yttrium fluoride or a material containing the yttrium fluoride on the surface of the base set to have a surface roughness within a predetermined range using atmospheric plasma such that a number of particles of the deposited material are welded.

On the other hand, a member made of metal such as a stainless steel alloy and an aluminum alloy is used also for the base member 41 that has no function as a ground. The surface of the base member 41 is also subjected to a process of improving a corrosion resistance against plasma or reducing wear, such as passivation treatment, spraying, PVD, and CVD, in order to suppress the corrosion, metal contamination and generation of particles by the exposure to the plasma 15.

In order to reduce the above-described interaction between the base member 41 and the plasma 15, a cylindrical cover (not illustrated) made of yttrium oxide or ceramics such as quartz may be disposed on the inner side of the inner wall surface of the base member 41 having a cylindrical shape between the base member 41 and the discharge chamber. Since such a cover is disposed between the base member 41 and the plasma 15, the contact of the base member 41 with highly reactive particles in the plasma 15 and the collision of charged particles are blocked or reduced, and the wear of the base member 41 can be suppressed.

The coating film 42 of the present embodiment was formed in such a manner that particles of yttrium oxide or a material containing the yttrium oxide, as an underlayer, were sprayed onto the ground electrode 40 made of an aluminum alloy using atmospheric plasma to form a film having a thickness of about 100 μm, and particles of yttrium fluoride or a material containing the yttrium fluoride were sprayed onto an underlayer film made of the yttrium oxide using atmospheric plasma to form a film having a thickness of about 100 μm.

The temperature of the surface of the coating film was about 135° C. at the time when the formation of the upper layer film made of yttrium fluoride was completed. After the formation of the coating film 42, a composition of the upper layer film made of yttrium fluoride was measured. As a result, a phase ratio of an orthorhombic crystal was 44% and an average crystallite size was 27 nm.

A ratio of the orthorhombic crystal of the coating film 42 made of yttrium fluoride or the material containing the yttrium fluoride was measured by X-ray diffraction. The X-ray diffraction was performed for 26 from 15° to 40° with an incident angle fixed at 1°. Results thereof are illustrated in FIG. 2.

Figure 2:
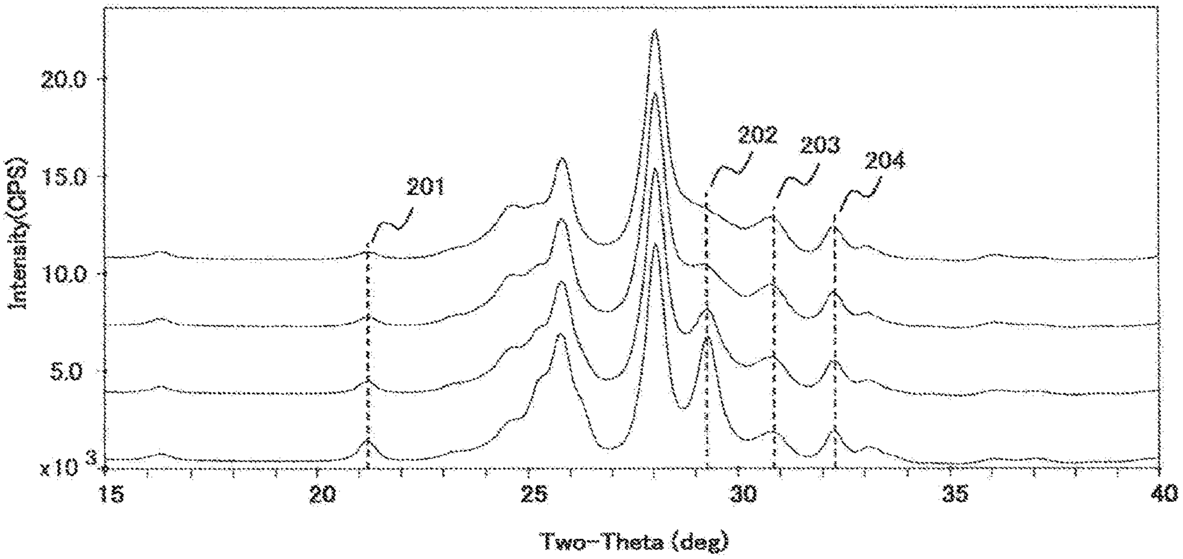
FIG. 2 is a graph illustrating an intensity of X-ray diffraction with respect to a surface of a coating film of a ground electrode disposed in the plasma processing apparatus according to the example illustrated in FIGS. 1A and 1B.

FIG. 2 is a graph illustrating an intensity of X-ray diffraction on the surface of the coating film 42 of the ground electrode 40 according to the embodiment illustrated in FIGS. 1A and 1B. As illustrated in FIG. 2, the coating film 42 contained yttrium fluoride and yttrium oxyfluoride.

For $YF_3$ as an orthorhombic crystal and $Y_5O_4F_7$ as an orthorhombic crystal, which are low-temperature phases, integrated intensities of diffracted X-rays were obtained from an $YF_3$ orthorhombic (210) plane indicated by a reference sign 203 in the vicinity of 2θ=31° and a $Y_5O_4F_7$ orthorhombic (0100) plane indicated by a reference sign 204 in the vicinity of 2θ=32.5°, respectively. In addition, for $YF_3$ as a hexagonal crystal and Y—O—F (which is certainly a hexagonal crystal based on indexing, but is denoted by Y—O—F since detailed crystal structure analysis has not been performed), which are high-temperature phases, integrated intensities of diffracted X-rays were obtained from an $YF_3$ hexagonal (001) plane indicated by a reference sign 201 in the vicinity of 2θ=210 and a Y—O—F hexagonal (111) plane indicated by a reference sign 202 in the vicinity of 2θ=29°, respectively. Using the obtained integrated intensity, a phase ratio was obtained by the reference intensity ratio (RIR) method.

Further, an average crystallite size of an upper layer made of yttrium fluoride of the coating film 42 was also measured by in-plane X-ray diffraction. The average crystallite size was measured for 2θ from 10° to 100° with an incident angle fixed at 1.5°. Each diffraction peak was indexed to obtain a full width half maximum and the average crystallite size was obtained by the Hall method.

Further, the generation of particles was evaluated for the treated surface of the coating film 42. As a result, the phase ratio of the orthorhombic crystal of the coating film 42 in which the number of generated particles was zero was 64%, and the average crystallite size thereof was 27 nm. In an evaluation of the generation of particles on the surface treated with another kind of surface treatment, the number of generated particles from the coating film 42 having the phase ratio of the orthorhombic crystal of 55% was 2.5.

Figure 3:
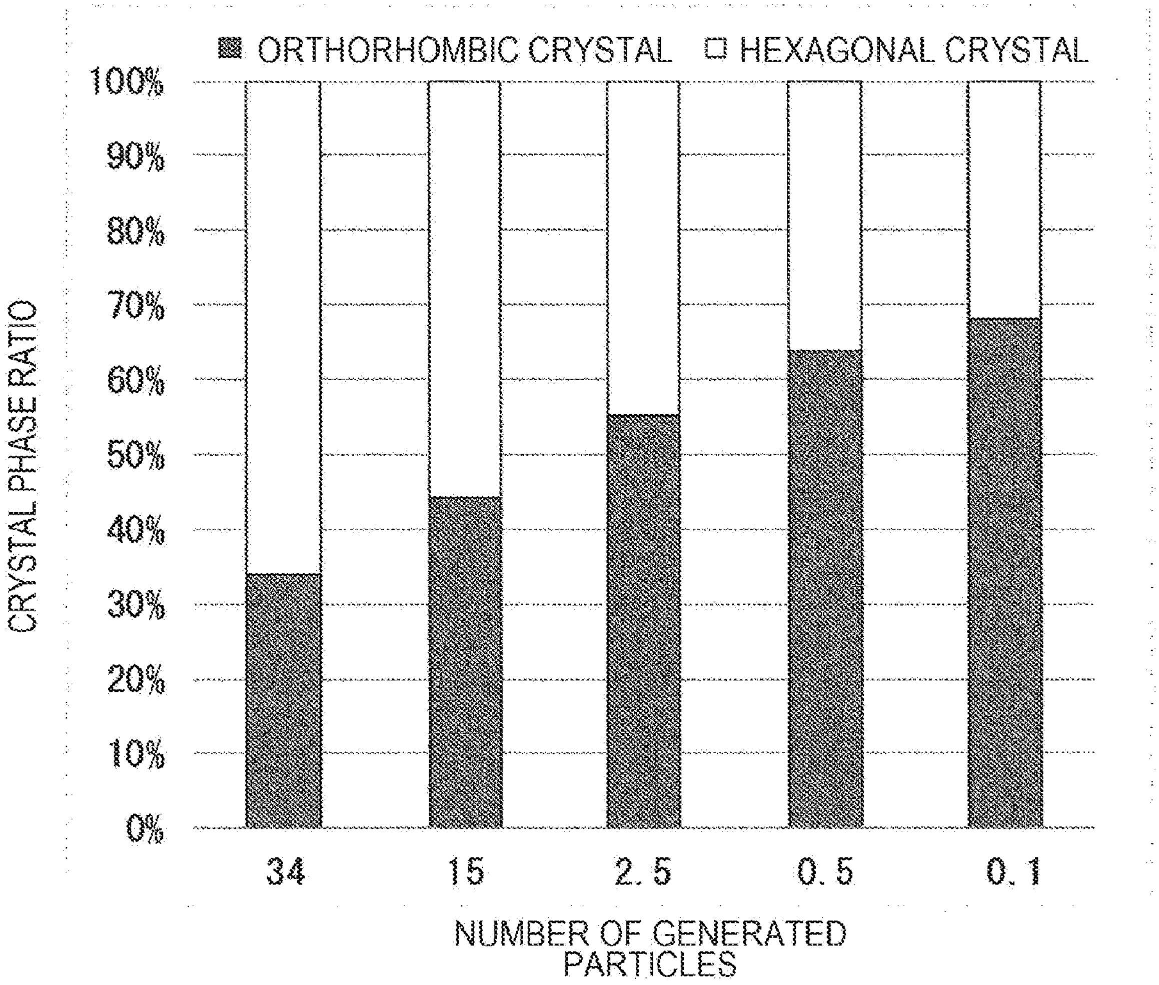
FIG. 3 is a graph illustrating a change in the number of generated particles from the coating film with respect to different crystal phase ratios of the coating film of the ground electrode disposed in the plasma processing apparatus according to the embodiment illustrated in FIGS. 1A and 1B.

Next, the number of generated particles was evaluated for each of a plurality of types of the coating films 42 in which the orthorhombic crystal ratio of the film layer made of yttrium fluoride is made to differ by varying condition at the time of spraying or varying by performing different kinds of surface treatment. Results thereof are illustrated in FIG. 3. FIG. 3 is a graph illustrating a change in the number of generated particles from the coating film with respect to different crystal phase ratios of the coating film of the ground electrode of the plasma processing apparatus according to the embodiment illustrated in FIGS. 1A and 1B.

The number of generated particles is counted in such a manner that the ground electrode 40 is disposed in the plasma processing apparatus, and ceramic parts (not illustrated) inside the base member 41 are made of quartz so that it is possible to understand that particles containing yttrium was generated with the ground electrode 40 as a generation source. The etching process described above was repeated, and particles remaining on the wafer were analyzed by SEM-EDX, and particles containing yttrium were counted.

As illustrated in FIG. 3, it has been found out from the evaluations that the number of generated particles gradually approaches zero after the phase ratio of the orthorhombic crystal in the film made of yttrium fluoride formed by the spraying method exceeds about 60%. The inventors have thus obtained a finding that it is possible to suppress the generation of particles from the film by forming the film using the spraying method such that the phase ratio of the orthorhombic crystal in the film made of yttrium fluoride becomes 60% or more.

Figure 4:
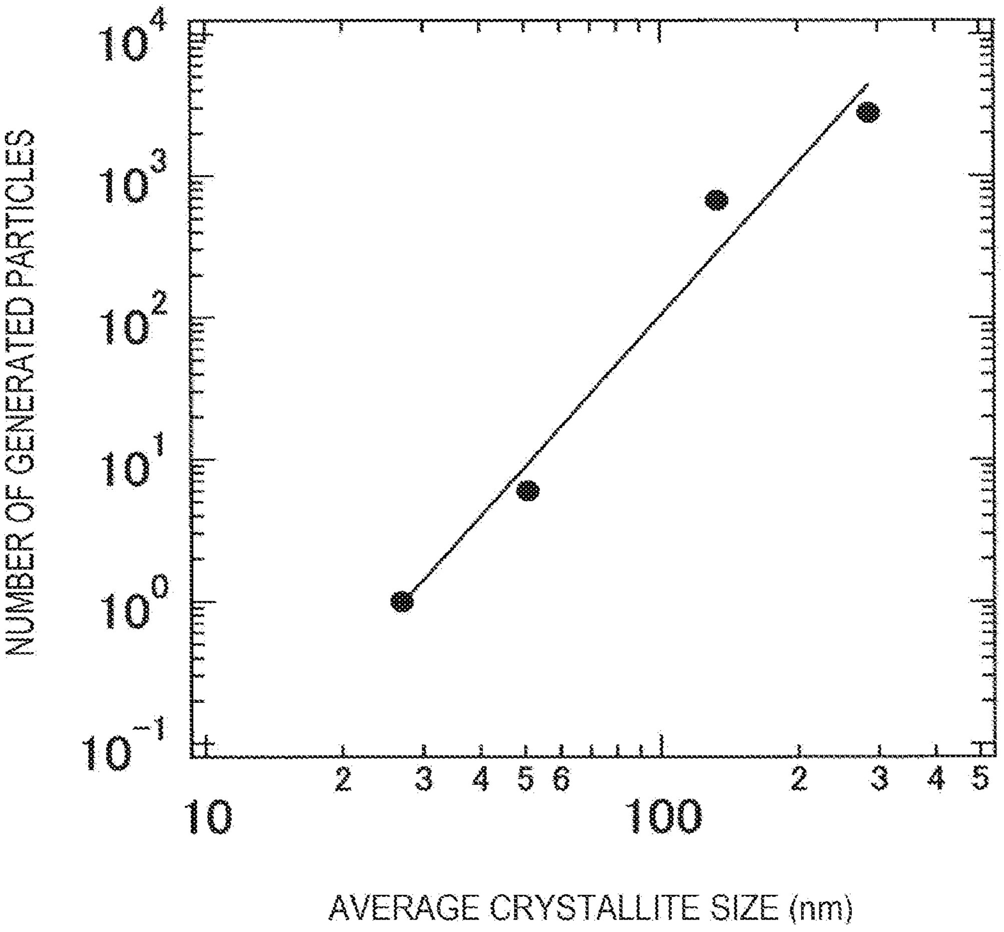
FIG. 4 is a graph illustrating a change in the number of generated particles accompanying a change in an average crystallite size of the coating film of the ground electrode disposed in the plasma processing apparatus according to the embodiment illustrated in FIGS. 1A and 1B.

In addition, the number of generated particles was compared for the coating films 42 as inner wall materials having different average crystallite sizes. Results thereof are illustrated in FIG. 4. FIG. 4 is a graph illustrating a change in the number of generated particles accompanying a change in the average crystallite size of the coating film of the ground electrode disposed in the plasma processing apparatus according to the embodiment illustrated in FIGS. 1A and 1B.

As illustrated in FIG. 4, it has been found out that the generation of particles is also reduced as the average crystallite size decreases. That is, a finding that it is possible to further suppress the number of generated particles as the crystallite size of the coating film 42 becomes smaller has been obtained. Therefore, the coating film 42 having a large average crystallite size was subjected to surface treatment and a change in the average crystallite size of the coating film 42 was investigated by changing a surface treatment time in order to obtain a value of the average crystallite size which serves as a threshold at which the number of generated particles changes. Results thereof are illustrated in FIG. 5.

Figure 5:
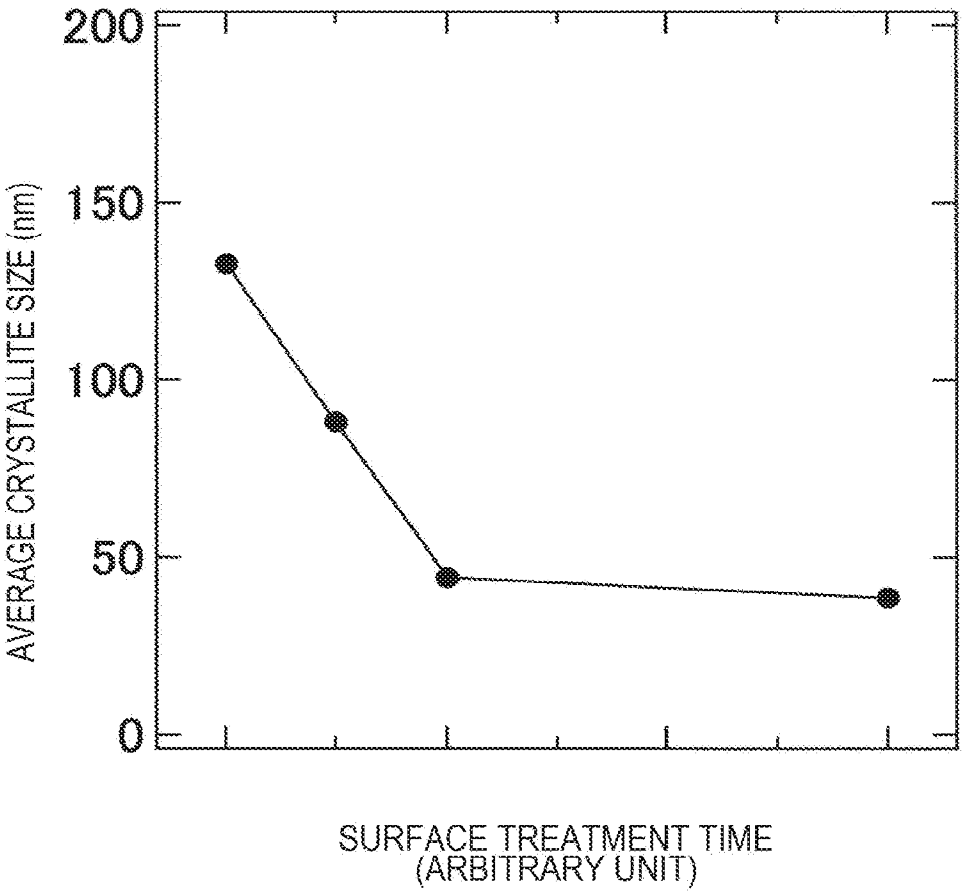
FIG. 5 is a graph illustrating a change in the average crystallite size with respect to a change in time for treatment on the surface of the coating film of the ground electrode disposed in the plasma processing apparatus according to the embodiment illustrated in FIGS. 1A and 1B.

FIG. 5 is a graph illustrating a change in the average crystallite size with respect to a change in time for treatment on the surface of the coating film of the ground electrode disposed in the plasma processing apparatus according to the embodiment illustrated in FIGS. 1A and 1B. As illustrated in FIG. 5, it has been found out that the average crystallite size decreases to a value of 50 nm or smaller as the time for the surface treatment becomes longer, and then, a rate of the decrease in the average crystallite size relative to the increase in processing time becomes gentle so that the average crystallite size gradually approaches a value between 45 and 50 nm in this example.

Based on the above results, the inventors of the present invention have obtained a finding that it is possible to suppress the change in the crystal size even if a cumulative value of the time during the interaction of the surface of the coating film 42 increases by setting the average crystallite size of the coating film 42 to 50 nm or smaller since the average crystallite size decreases and gradually approaches to the value of 45 to 50 nm along with the time increase as above. In the present embodiment, the coating film 42, formed by spraying and made of the material containing yttrium fluoride to cover the surface on the side facing the discharge chamber of the ground electrode 40 and in contact with the plasma 15, is formed such that the phase ratio of the orthorhombic crystal is 60% or more and the average crystallite size is 50 nm or smaller as described above. In this manner, the generation of particles from the film on the upper layer of the coating film 42 made of the material containing yttrium fluoride is suppressed.

In the above example, yttrium oxide as an underlayer was sprayed on the ground electrode 40 made of the aluminum alloy using atmospheric plasma to form a thickness of about 100 μm, and particles containing yttrium fluoride as a material were sprayed thereon using atmospheric plasma to form an upper layer film so as to have the thickness of about 100 μm. The temperature of the surface of the upper layer film at the completion of such formation was 135° C. As another example of the formation of the coating film 42 according to the present embodiment, heat may be spontaneously dissipated to cool the surface temperature up to about 67° C. after forming the upper layer film, and thereafter, a thin film may be formed by spraying particles containing yttrium fluoride using atmospheric plasma.

In this example, the upper layer film of the coating film 42 had the orthorhombic crystal phase ratio of 34% and the average crystallite size of 33 nm. Further, the upper layer film of the coating film 42 was subjected to surface treatment such that the average crystallite size of the coating film 42 became 37 nm and the orthorhombic crystal phase ratio became 68%. As a result of evaluating the number of generated particles from this coating film 42, the number of generated particles was 0.1.

In this evaluation, an X-ray used for the X-ray measurement is a Cu Kα ray, and a maximum detection depth in an angular range where a diffracted ray is obtained is about 5 μm. From this example, it is suggested that the generation of particles can be suppressed by appropriately setting the state of the crystallite in a thickness range of several μm to 5 μm of the surface of the coating film 42. When the material containing yttrium fluoride is sprayed using atmospheric plasma, a coating film is formed at 15 to 30 μm/pass.

Figure 6:
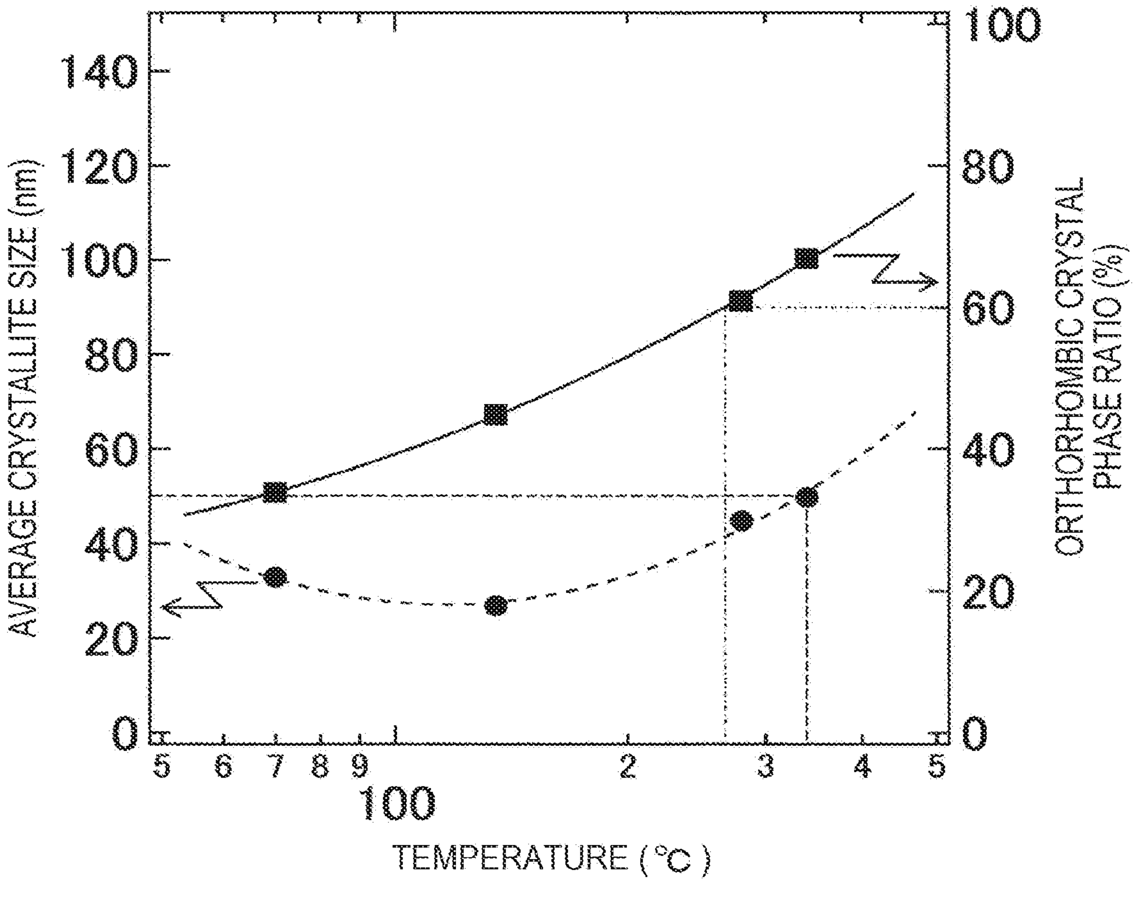
FIG. 6 is a graph illustrating changes in an orthorhombic crystal phase ratio and an average crystallite size with respect to a change in temperature of the surface at the time of forming the coating film of the ground electrode disposed in the plasma processing apparatus according to the embodiment illustrated in FIGS. 1A and 1B.

Therefore, a correlation between the orthorhombic crystal phase ratio and the average crystallite size of the film made of the material containing yttrium fluoride was studied focusing on the temperature of the surface of the formed film when spraying the material containing yttrium fluoride with atmospheric plasma. Results thereof are illustrated in FIG. 6. FIG. 6 is a graph illustrating changes in an orthorhombic crystal phase ratio and an average crystallite size with respect to a change in temperature of the surface at the time of forming the coating film of the ground electrode disposed in the plasma processing apparatus according to the embodiment illustrated in FIGS. 1A and 1B.

In FIG. 6, the average crystallite size is indicated by a mark of a closed circle on the left axis, the orthorhombic crystal phase ratio is indicated by a mark of a black square on the right axis. It is understood that the orthorhombic crystal phase ratio increases as the surface temperature increases. On the other hand, it is understood that the average crystallite size increases before and after 130° C. with a value at around 130° C. as the minimum.

This result indicates that there is a range where both the orthorhombic crystal phase ratio and the average crystallite size increase along with an increase of a value of the surface temperature at the time of forming the film by spraying the material made of yttrium fluoride using atmospheric plasma, and it is possible to define a lower limit and an upper limit of the temperature at which the film of the coating film 42 made of yttrium fluoride capable of suppressing the generation of particles can be formed using the orthorhombic crystal phase ratio and the average crystallite size, respectively. In the example illustrated in FIG. 6 of the present embodiment, 280° C. or higher was set as the range of the temperature at which the orthorhombic crystal phase ratio is 60% or more, and 350° C. or lower was set as the range of the temperature at which the average crystallite size is 50 nm or smaller.

An underlayer film was formed by spraying yttrium oxide as an underlayer on the surface of the base of the ground electrode 40 made of the aluminum alloy using atmospheric plasma to have a thickness of about 100 μm, and an upper layer film was formed by spraying particles containing yttrium fluoride as the material thereon using atmospheric plasma. After confirming that the surface temperature when the thickness of the upper layer film was about 100 μm was about 280° C., the last one layer was formed by spraying using the atmospheric plasma to form the coating film 42. As a result, the coating film 42 of the yttrium fluoride material having an orthorhombic crystal phase ratio of 61% and an average crystallite size of 41 nm was formed. The plurality of wafers 4 were processed using the plasma processing apparatus including the ground electrode 40 and the generation of particles was evaluated until the cumulative processing time reached a predetermined value. As a result of exponential least squares fitting of temporal transition of the number of particles, the number of generated particles was 0.7.

Further, in another example, yttrium oxide as an underlayer was sprayed on the ground electrode 40 made of the aluminum alloy using atmospheric plasma to form a thickness of about 100 μm, and then, a material containing yttrium fluoride was sprayed thereon using atmospheric plasma to form the upper layer film so as to have a thickness of about 100 μm. The upper layer film was formed by spraying such that the surface temperature of the film during the formation did not exceed about 150° C.

Next, the surface of the coating film 42 was subjected to surface treatment by heating using a halogen lamp. A correlation between a sample temperature and a lamp output was acquired in advance by using another coating film of the same material in which a thermocouple was embedded, and the lamp was scanned so as to perform heating for a short time while controlling the output such that the temperature did not exceed 350° C. in the actual surface heating of the coating film.

Due to light heating using two halogen lamps (with an output of 0.45 kW) and rapid cooling by cold air blowing under conditions that the air temperature at a focal position was about 600° C. and the sample temperature was 341° C., an orthorhombic crystal phase ratio of the resulting coating film 42 was 67%, and an average crystallite size was 45 nm. The ground electrode 40 was used to evaluate the generation of particles for a predetermined processing time, and the number of generated particles was zero. Although the halogen lamp was used in the embodiment, the same effect can be obtained by heating using an infrared lamp or laser light.

In still another embodiment, yttrium oxide as an underlayer was sprayed on the ground electrode 40 made of the aluminum alloy using atmospheric plasma to form a thickness of about 100 μm, and an yttrium fluoride-based material was sprayed thereon as the coating film 42 using atmospheric plasma to form a thickness of about 100 μm. The film was formed such that the surface temperature did not exceed about 150° C. during the atmospheric plasma spraying. As a result of chemical treatment of the surface of the resulting coating film 42, an orthorhombic crystal phase ratio of the coating film 42 of the yttrium fluoride-based material was 32% and an average crystallite size was 31 nm.

Therefore, surface heating by electron/ion beams was carried out. The ground electrode 40 was placed in the vacuum chamber, and the surface of the coating film 42 was irradiated with electron beams.

Since the inner wall material is ceramics, the surface of the coating film 42 is charged with accumulation of negative charges when being irradiated with the electron beams. Therefore, the same place was irradiated with Ar ion beams using an Ar ion gun. The Ar ion gun performed irradiation with an acceleration voltage of several tens eV in order to reduce irradiation damage. The surface temperature was measured using an infrared thermometer, and the setting temperature was controlled at 340° C. so as not to exceed 350° C.

By such additional heating, the coating film 42 could have an orthorhombic crystal phase ratio of 69% and an average crystallite size of 50 nm. The ground electrode 40 was used to evaluate the generation of particles for a predetermined processing time, and the number of generated particles was zero.

What is claimed is:

1. A manufacturing method comprising a step of:

forming a coating film on a region of a surface by plasma spraying in atmosphere of yttrium fluoride or a material containing the yttrium fluoride, wherein the surface constitutes an inner wall surface of a member disposed inside a vacuum container of a plasma processing apparatus, wherein the inner wall surface is constructed to be exposed to plasma of a processing chamber disposed inside the vacuum container and in which plasma is generated, wherein a ratio of an orthorhombic crystal of the yttrium fluoride or the material containing the yttrium fluoride in the coating film relative to entirety which is sprayed and disposed on the region of the surface is 60% or more, and wherein a size of the crystal of the yttrium fluoride or a material containing the yttrium fluoride in the coating film which is sprayed and disposed on the region of the surface is 50 nm or smaller, and wherein the step of forming the coating film further comprises maintaining the region of the surface of the member or a surface of the coating film at 280° C. or higher and at 350° C. or lower.

2. A method of manufacturing a member of a plasma processing chamber in which plasma generated, the method comprising:

forming a coating film by spraying particles of the yttrium fluoride or the material containing the yttrium fluoride using atmospheric plasma onto the member, wherein the member comprises an inner wall surface of the plasma processing chamber and is disposed on a surface to be exposed to the plasma, wherein a ratio of an orthorhombic crystal of the yttrium fluoride or the material containing the yttrium fluoride in the coating film relative to entirety which is sprayed and disposed on the region of the surface is 60% or more, and wherein a size of the crystal of the yttrium fluoride or a material containing the yttrium fluoride in the coating film which is sprayed and disposed on the region of the surface is 50 nm or smaller, and wherein the step of forming the coating film further comprises maintaining the region of the surface of the member or a surface of the coating film at 280° C. or higher and at 350° C. or lower.

* * * * *